(12) United States Patent
Liu et al.

(10) Patent No.: US 11,988,468 B2
(45) Date of Patent: May 21, 2024

(54) HEAT SINK AND HOUSING ASSEMBLY

(71) Applicant: Tyco Electronics (Shanghai) Co. Ltd., Shanghai (CN)

(72) Inventors: WenYu Liu, Shanghai (CN); Lei Liu, Shanghai (CN); Hongqiang Han, Shanghai (CN); Jiwang Jin, Shanghai (CN); Yan Lee, Shanghai (CN); Zhicheng Li, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 51 days.

(21) Appl. No.: 16/587,546

(22) Filed: Sep. 30, 2019

(65) Prior Publication Data

US 2020/0103180 A1 Apr. 2, 2020

(30) Foreign Application Priority Data

Sep. 30, 2018 (CN) .......................... 201811165470.8

(51) Int. Cl.
*F28F 3/04* (2006.01)
*H01R 12/58* (2011.01)
(Continued)

(52) U.S. Cl.
CPC ............... *F28F 3/04* (2013.01); *H01R 12/58* (2013.01); *H01R 13/46* (2013.01); *H01R 13/6581* (2013.01); *F28F 2280/00* (2013.01)

(58) Field of Classification Search
CPC ...... F28D 2021/0028; F28D 2021/0029; F28F 3/06; F28F 2280/00; H05K 7/20; H05K 7/2039; H05K 7/20418; H05K 7/20445; H05K 7/20472; H05K 7/2049; H05K 7/20509; H05K 7/20854; H05K 7/209; H01L 21/4878; H01L 21/4882; H01L 23/36; H01L 23/3672; H01L 23/40; H01L 2023/4062; H01L 23/4093
See application file for complete search history.

(56) References Cited

U.S. PATENT DOCUMENTS 5,777,259 A * 7/1998 Mennucci ........... H01L 23/3672
165/185
5,969,949 A * 10/1999 Kim ..................... H01L 23/4006
165/185

(Continued)

FOREIGN PATENT DOCUMENTS

CN 206055571 U 3/2017
CN 106990488 A 7/2017
CN 206821128 U 12/2017

OTHER PUBLICATIONS

Fourth Examination Opinion from the National Intellectual Property Office of Administration of China dated May 15, 2023 with English translation, corresponding to Application No. 201811165470.8, 11 pages.

*Primary Examiner* — Raheena R Malik
(74) *Attorney, Agent, or Firm* — Barley Snyder

(57) ABSTRACT

A heat sink includes a heat sink body having a plurality of stacked fins and a mounting base. The mounting base has a first heat dissipation plate and a second heat dissipation plate. A first surface of the first heat dissipation plate is connected to a bottom of the heat sink body. The second heat dissipation plate is mounted on a second surface of the first heat dissipation plate opposite to the first surface.

20 Claims, 6 Drawing Sheets

(51) Int. Cl.
  *H01R 13/46* (2006.01)
  *H01R 13/6581* (2011.01)

(56) References Cited

U.S. PATENT DOCUMENTS

| | | | | |
|---|---|---|---|---|
| 6,082,443 | A * | 7/2000 | Yamamoto | F28D 15/0233 |
| | | | | 165/104.21 |
| 6,089,315 | A * | 7/2000 | Lee | H01L 23/3675 |
| | | | | 165/185 |
| 6,401,810 | B1 * | 6/2002 | Kuo | F28F 3/02 |
| | | | | 165/185 |
| 6,607,028 | B1 * | 8/2003 | Wang | F28F 3/02 |
| | | | | 165/185 |
| 6,749,448 | B2 * | 6/2004 | Bright | G02B 6/4201 |
| | | | | 439/160 |
| 6,765,799 | B1 * | 7/2004 | Huang | H01L 23/3672 |
| | | | | 165/185 |
| 6,816,376 | B2 | 11/2004 | Bright et al. | |
| 6,966,361 | B2 * | 11/2005 | Connors | F28D 15/0233 |
| | | | | 165/104.33 |
| 6,980,437 | B2 | 12/2005 | Bright | |
| 7,070,446 | B2 | 7/2006 | Henry et al. | |
| 7,355,857 | B2 * | 4/2008 | Pirillis | H05K 9/0058 |
| | | | | 361/715 |
| 7,426,956 | B2 * | 9/2008 | Lin | F28D 15/0275 |
| | | | | 165/182 |
| 7,610,948 | B2 * | 11/2009 | Huang | H01L 23/427 |
| | | | | 165/104.33 |
| 8,051,896 | B2 * | 11/2011 | Wayman | H01L 23/373 |
| | | | | 165/80.3 |
| 8,345,445 | B2 * | 1/2013 | Del Prete | G06F 1/20 |
| | | | | 361/804 |
| 8,449,331 | B2 * | 5/2013 | Phillips | H01R 13/6581 |
| | | | | 439/607.21 |
| 8,535,787 | B1 * | 9/2013 | Lima | B32B 27/281 |
| | | | | 428/195.1 |
| 8,857,502 | B2 * | 10/2014 | Huang | F28D 15/0233 |
| | | | | 165/104.26 |
| 8,879,267 | B2 * | 11/2014 | Henry | H04L 12/6418 |
| | | | | 361/715 |
| 8,881,793 | B2 * | 11/2014 | Huang | F28D 15/02 |
| | | | | 29/890.032 |
| 8,885,342 | B2 * | 11/2014 | Skepnek | H01L 23/433 |
| | | | | 361/709 |
| 9,137,928 | B2 * | 9/2015 | Chen | H05K 7/2039 |
| 9,696,506 | B2 * | 7/2017 | Wu | G02B 6/4269 |
| 9,939,858 | B2 * | 4/2018 | Lin | G06F 1/203 |
| 9,980,411 | B2 * | 5/2018 | Yang | H05K 7/20418 |
| 10,069,248 | B2 * | 9/2018 | Su | H01R 13/6583 |
| 2001/0001416 | A1 * | 5/2001 | Lee | H01L 23/3672 |
| | | | | 165/80.3 |
| 2002/0024797 | A1 * | 2/2002 | Chen | H01L 23/3672 |
| | | | | 361/704 |
| 2003/0155103 | A1 * | 8/2003 | Barten | F28F 3/025 |
| | | | | 165/80.3 |
| 2003/0184969 | A1 * | 10/2003 | Itabashi | H01L 23/3677 |
| | | | | 361/688 |
| 2003/0184981 | A1 * | 10/2003 | Daniels | H05K 7/20445 |
| | | | | 361/752 |
| 2004/0027816 | A1 * | 2/2004 | Ice | G02B 6/4201 |
| | | | | 361/797 |
| 2004/0084764 | A1 * | 5/2004 | Ishimine | H01L 23/4006 |
| | | | | 257/706 |
| 2004/0194922 | A1 * | 10/2004 | Lee | H01L 23/3672 |
| | | | | 257/E23.103 |
| 2004/0238946 | A1 * | 12/2004 | Tachibana | H01L 23/3732 |
| | | | | 257/706 |
| 2005/0270741 | A1 * | 12/2005 | Wang | H01L 23/4006 |
| | | | | 361/695 |
| 2007/0147002 | A1 * | 6/2007 | Otsuki | H01L 23/467 |
| | | | | 361/704 |
| 2007/0177355 | A1 * | 8/2007 | Ito | H01L 23/3672 |
| | | | | 361/709 |
| 2008/0073069 | A1 * | 3/2008 | Wu | H01L 21/4882 |
| | | | | 165/185 |
| 2008/0192427 | A1 * | 8/2008 | Wu | H01L 23/427 |
| | | | | 361/679.52 |
| 2009/0027858 | A1 * | 1/2009 | Lai | H01L 23/4093 |
| | | | | 361/709 |
| 2009/0034204 | A1 * | 2/2009 | Wayman | H01L 23/3677 |
| | | | | 361/709 |
| 2010/0025014 | A1 * | 2/2010 | Zha | H01L 23/427 |
| | | | | 165/80.3 |
| 2010/0232108 | A1 * | 9/2010 | Chuang | H01L 23/467 |
| | | | | 361/697 |
| 2010/0263850 | A1 * | 10/2010 | Huang | H01L 23/3672 |
| | | | | 165/185 |
| 2010/0276114 | A1 * | 11/2010 | Peeters | A61F 7/00 |
| | | | | 165/11.1 |
| 2011/0267771 | A1 * | 11/2011 | Cheng | G06F 1/20 |
| | | | | 361/679.54 |
| 2011/0308776 | A1 * | 12/2011 | Huang | H01L 23/3672 |
| | | | | 165/121 |
| 2011/0315366 | A1 * | 12/2011 | Chen | B21D 53/085 |
| | | | | 165/185 |
| 2012/0018137 | A1 * | 1/2012 | Chang | F28D 15/0233 |
| | | | | 165/185 |
| 2012/0126280 | A1 * | 5/2012 | Lee | H01L 33/642 |
| | | | | 257/99 |
| 2012/0126387 | A1 * | 5/2012 | Fishley | H01L 23/3128 |
| | | | | 257/690 |
| 2012/0145374 | A1 * | 6/2012 | Chen | H01L 23/3672 |
| | | | | 165/185 |
| 2012/0318481 | A1 * | 12/2012 | Yuan | G06F 1/20 |
| | | | | 165/104.26 |
| 2013/0048251 | A1 * | 2/2013 | Xiao | F28D 15/046 |
| | | | | 165/104.26 |
| 2013/0299154 | A1 * | 11/2013 | Lin | H01L 23/427 |
| | | | | 165/185 |
| 2015/0289357 | A1 * | 10/2015 | Wakana | H05K 1/181 |
| | | | | 174/535 |
| 2016/0284624 | A1 * | 9/2016 | Yamada | H01L 23/3675 |
| 2017/0110411 | A1 * | 4/2017 | Meyer, IV | H05K 7/2029 |
| 2019/0003775 | A1 * | 1/2019 | Lin | H05K 7/209 |

\* cited by examiner

HEAT SINK AND HOUSING ASSEMBLY

CROSS-REFERENCE TO RELATED APPLICATION

This application claims the benefit of the filing date under 35 U.S.C. § 119(a)-(d) of Chinese Patent Application No. 201811165470.8, filed on Sep. 30, 2018.

FIELD OF THE INVENTION

The present invention relates to a heat sink and, more particularly, to a heat sink for an electronic device.

BACKGROUND

In a network communication device, during operation of an electronic device such as a high-speed input/output electrical connector, a module for processing electronic data plugged into an electrical connector socket generally generates heat. Inferior heat dissipation of the high-speed input/output electrical connector, for example, reduces electrical performance of the electronic device. It is necessary to mount a heat sink on the housing of the electronic device to reduce the temperature of the electronic device. When the heat sink is mounted on the housing, a part of the heat sink is generally fixed to the housing by a mounting frame to simplify the mounting operation.

The heat sink of the conventional high-speed electrical connector generally comprises machining parts such as a fin and a base arranged on a housing of the connector. The machining process is costly and impairs high-efficiency and mass production.

SUMMARY

A heat sink includes a heat sink body having a plurality of stacked fins and a mounting base. The mounting base has a first heat dissipation plate and a second heat dissipation plate. A first surface of the first heat dissipation plate is connected to a bottom of the heat sink body. The second heat dissipation plate is mounted on a second surface of the first heat dissipation plate opposite to the first surface.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
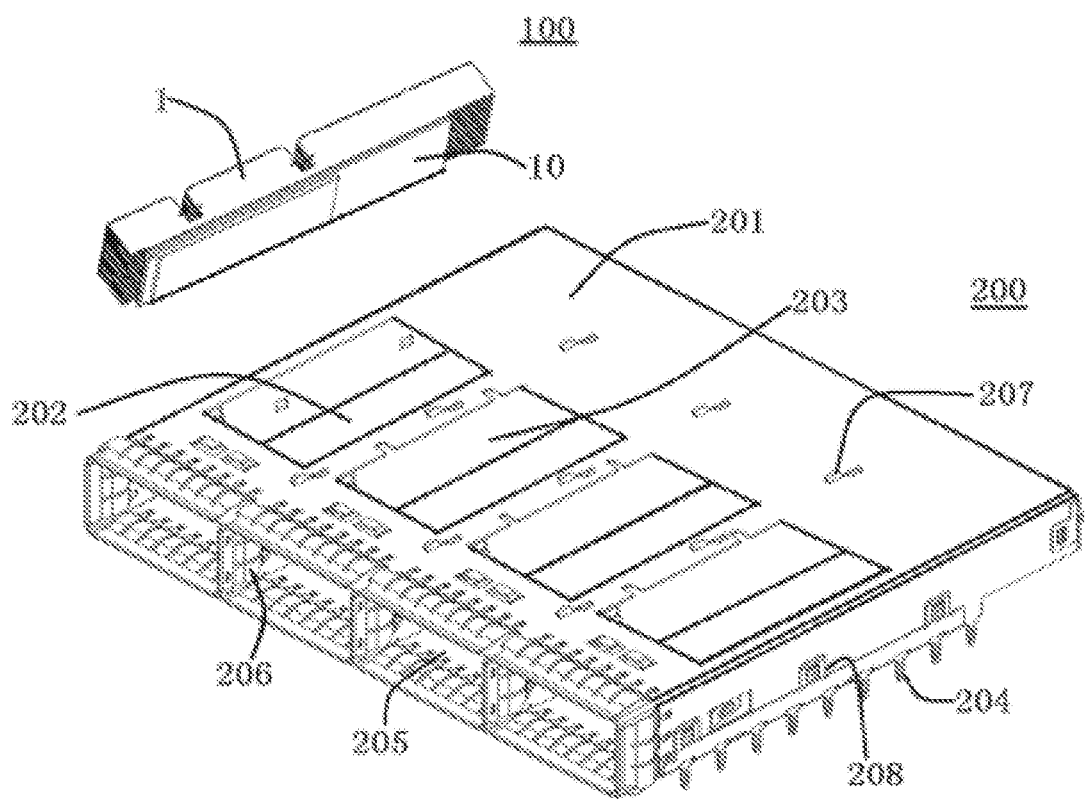
FIG. 1 is an exploded perspective view of a housing assembly according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided to convey the concept of the disclosure to those skilled in the art.

In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A housing assembly according to an embodiment, as shown in FIG. 1, comprises a housing 200 and at least one heat sink 100. The housing 200, in an embodiment, is made of a metal sheet.

The housing 200, as shown in FIG. 1, has a generally cuboid shape and has a top wall 201, a bottom wall, and a pair of side walls. Three partition plates 203 are installed between the top wall 201 and the bottom wall to divide an interior of the housing 200 into, in the shown embodiment, four accommodating chambers 205 extending in a longitudinal direction. Electronic modules, which may generate heat during operation, for example, electronic devices such as electrical connectors, CPUs, amplifiers; photoelectric converters; disk readers; and the like, may be accommodated in the accommodating chambers 205. Each accommodating chamber 205 has an opening 202 formed in the top wall 201 of the housing 200.

The housing 200, as shown in the embodiment of FIG. 1, has four accommodating chambers 205 therein. The four accommodating chambers 205 are adapted to accommodate four electronic modules (not shown). In other embodiments, one, two, four or more accommodating chambers 205 may be provided in the housing 200 as desired, with an opening 202 formed in the top wall 201 of each accommodating chamber 205.

As shown in FIGS. 1-6, the heat sink 100 comprises a heat sink body 1 and a mounting base 10. The heat sink body 1 has a plurality of stacked fins 11, for example, made of aluminum. The thickness of each fin 1, in an embodiment, is about 0.2 mm. The mounting base 10 has a first heat dissipation plate 2 and a second heat dissipation plate 3. A first surface (top surface) of the first heat dissipation plate 2 is connected to a lower portion of the heat sink body 1. The second heat dissipation plate 3 is provided on a portion of a second surface (bottom surface) of the first heat dissipation plate 2 opposite to the first surface, and the area of the second heat dissipation plate 3 is smaller than that of the first heat dissipation plate 2 to form a protrusion protruding away from the heat sink body 1. In an embodiment, both the first heat dissipation plate 2 and the second heat dissipation plate 3 are rectangular, and the length of the second heat dissipation plate 3 is smaller than that of the first heat dissipation plate 2. In another embodiment, both the first heat dissipation plate 2 and the second heat dissipation plate 3 are rectangular, and the width of the second heat dissipation plate 3 is smaller than that of the first heat dissipation plate 2. Both the first heat dissipation plate 2 and the second heat dissipation plate 3 may be made of aluminum, aluminum alloy, or copper sheet to improve the heat dissipation effect.

The second heat dissipation plate 3 is adapted to be in contact with the electronic module to transfer heat generated by the electronic module to the heat sink body 1, thereby dissipating heat from the electronic module. The heat sink 100 is mounted on the top wall 201 of the housing 200, the first heat dissipation plate 2 is located outside the accommodating chamber, and the second heat dissipation plate 3 of the heat sink 100 passes through the opening 203 to be in direct contact with the electronic module accommodated in the accommodating chamber 205, thereby improving the heat dissipation effect of the electronic module.

Figure 2:
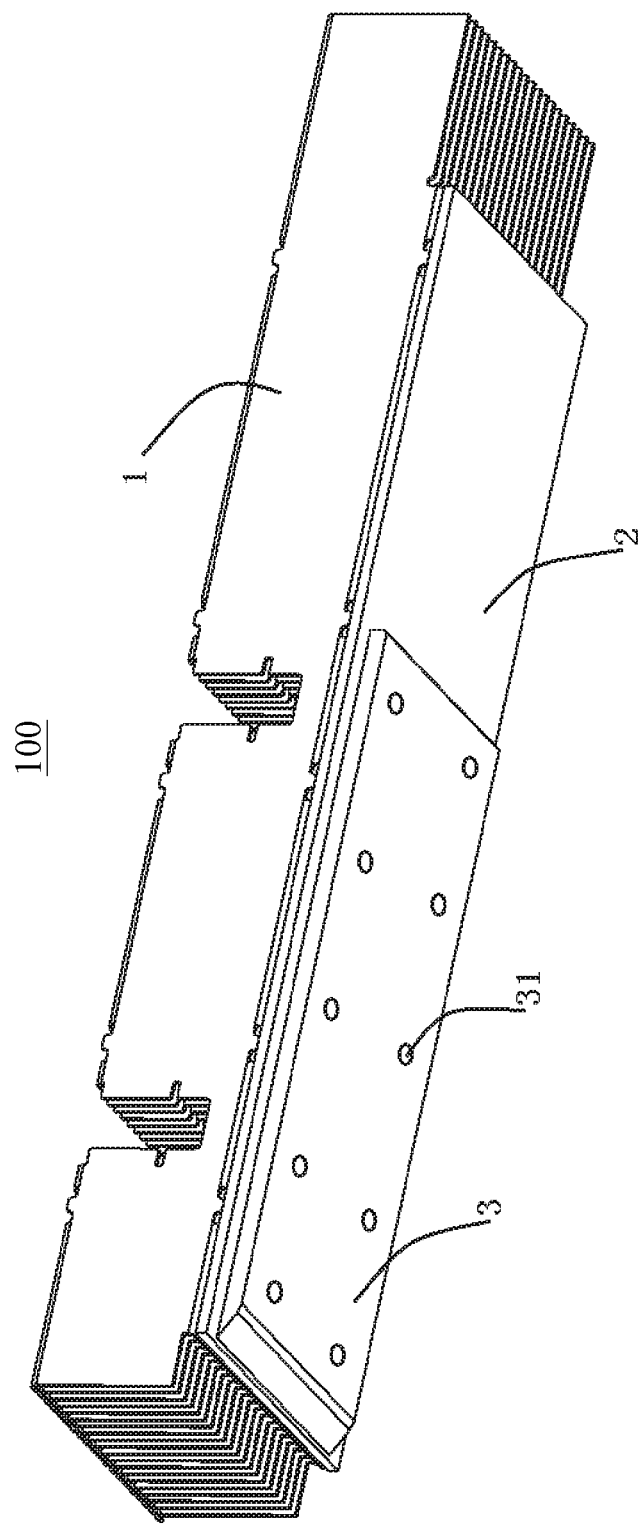
FIG. 2 is a perspective view of a heat sink of the housing assembly.
Figure 3:
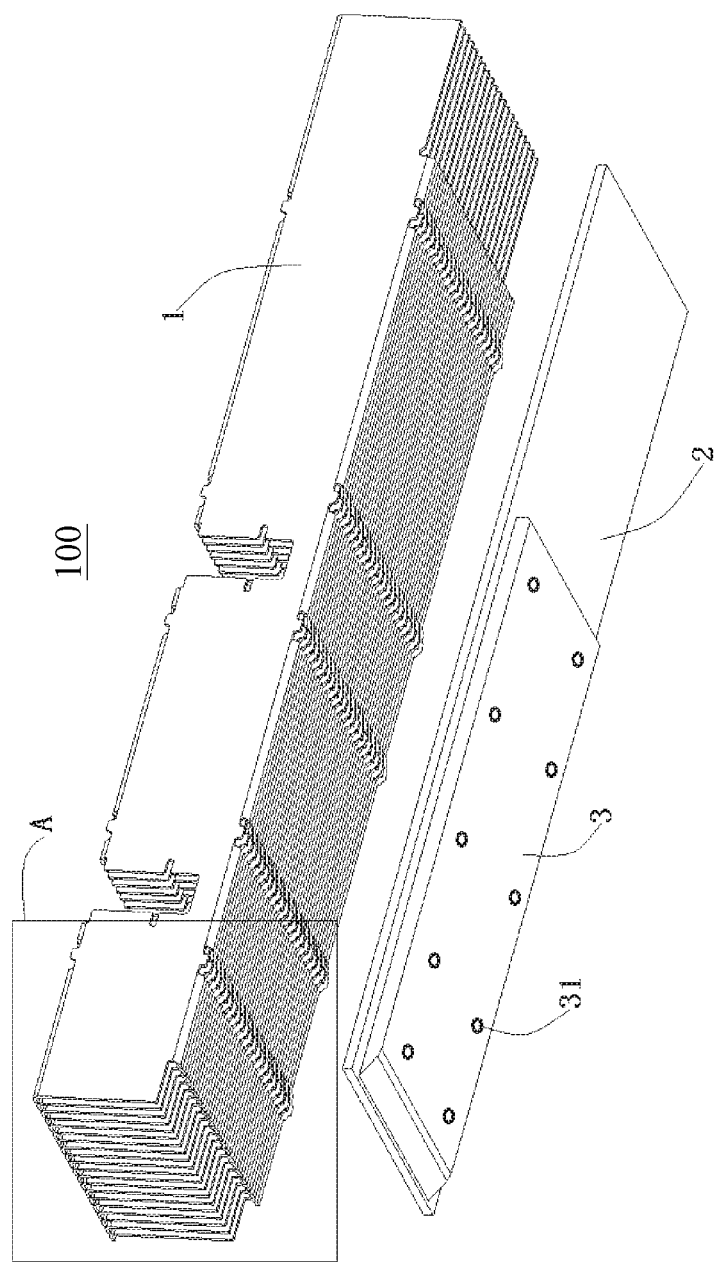
FIG. 3 is an exploded perspective view of the heat sink.
Figure 5:
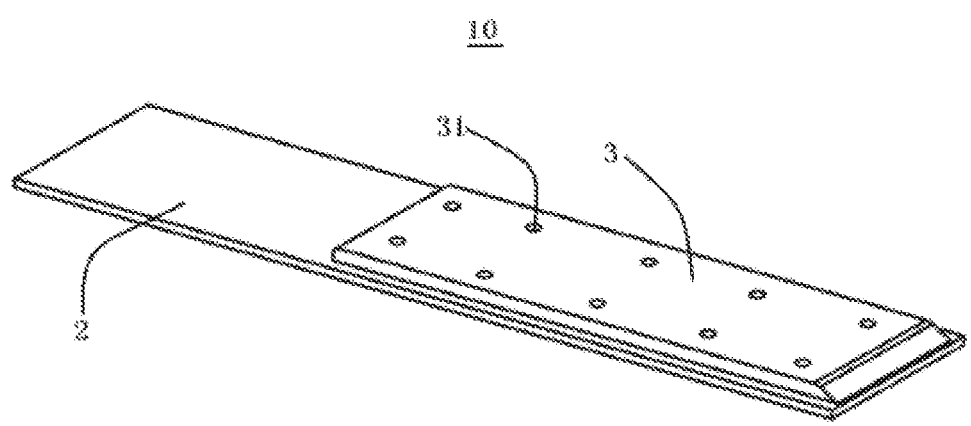
FIG. 5 is a perspective view of a mounting base of the heat sink.

Because the second heat dissipation plate 3 is fixed on the second surface of the first heat dissipation plate 2, the first surface of the first heat dissipation plate 2 may be flat. In this way, the bottom surface of the heat sink body 1 has a large flat portion, thereby facilitating the fabrication of the heat sink body 1. As shown in FIGS. 2, 3, and 5, the second heat dissipation plate 3 is fixed to the first heat dissipation plate 2 by rivets 31. Different numbers of second heat dissipation plates 3 may be provided and stacked together according to the height of the protrusion to be formed. The manufacturing process of the mounting base 10 is simple, and the cost of the heat sink 100 is reduced.

Figure 7:
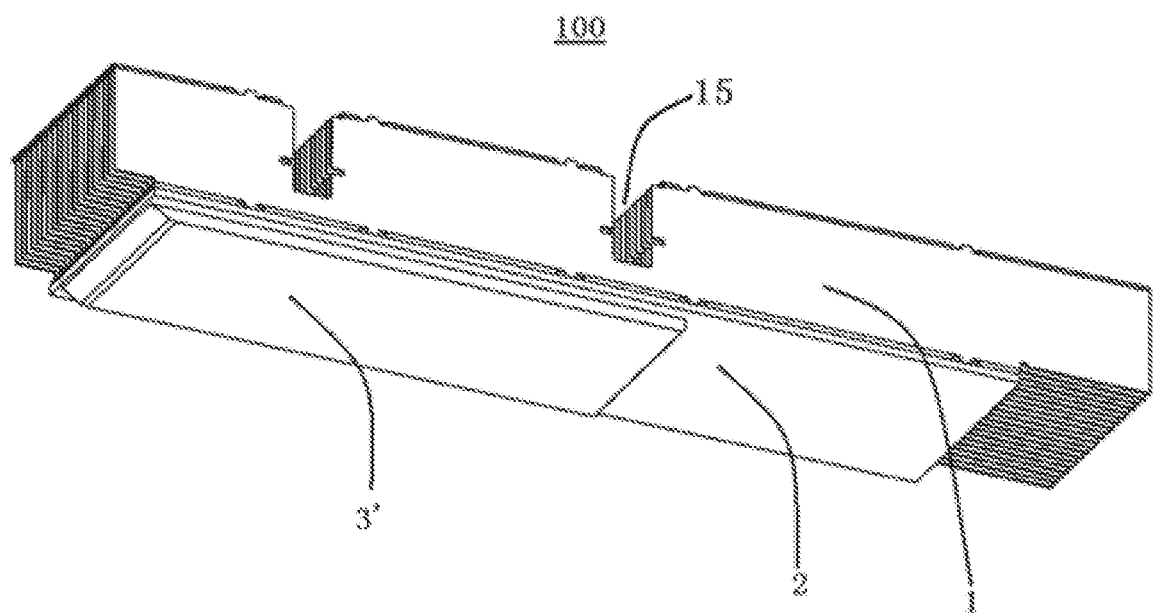
FIG. 7 is a perspective view of a heat sink according to another embodiment.

The heat sink body 1, as shown in FIG. 7, has as plurality of grooves 15 for accommodating fixing members. Accordingly, fixing protrusions 208, shown in FIG. 1, are formed on the side walls of the housing 200, and the heat sink 100 may be mounted to the housing 200 by a generally arcuate-shaped fixing member passing through the grooves 15 and snap-fitted with the fixing protrusions 208.

Figure 4:
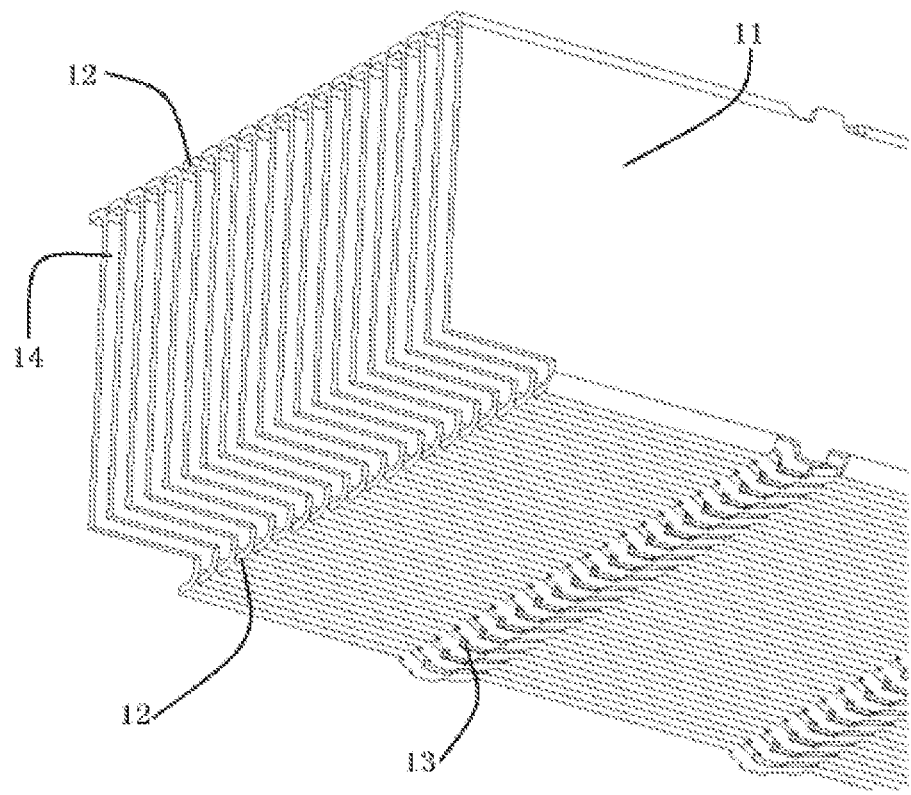
FIG. 4 is a perspective view of a portion A of FIG. 3.

As shown in FIG. 4, at least one of the upper and lower edges of each fin 11 has a folded edge 12, and the plurality of fins 11 are connected in sequence by the plurality of folded edges 12. For example, a lamination process may be performed such that the plurality of fins 11 are connected in sequence by the plurality of folded edges 12, and a ventilation channel 14 is formed between two adjacent fins 11. The lower edge of each fin 11 has a tab 13 extending downward, and the tabs 13 of the plurality of fins 11 are arranged in a row so as to form a protrusion extending in a lateral direction of the heat sink body 1. A welding operation may be performed at each tab 13 to fix the heat sink 1 to the first heat dissipation plate 2.

Each partition plate 203, as shown in FIG. 1, has at least one positioning portion 207 extending out of the top wall 201 and the bottom wall of the housing 200. The positioning portion 207 is bent after passing through the top wall 201 and the bottom wall to fix the partition plate 203.

In the case where the electronic module is an electrical connector, as shown in FIG. 1, the housing 200 has a generally cuboid shape, and the front portion of the housing 200 has openings for receiving mating electrical connectors. The edges of the openings have an elastic electromagnetic shielding sheet 206 for increasing the electromagnetic shielding performance between the housing 200 and the electronic module. The lower portion of the housing has a plurality of pins 204 for mounting to a mounting device such as a circuit board.

Figure 6:
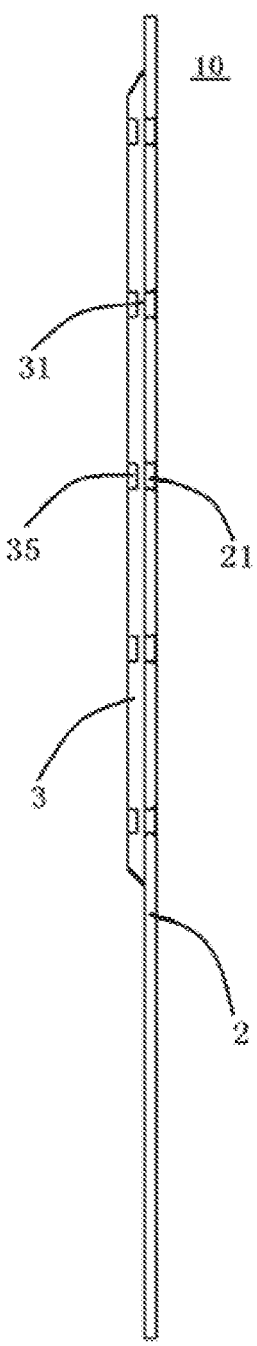
FIG. 6 is a side view of the mounting base.

In the mounting base 10, as shown in FIG. 6, a plurality of second positioning holes 35 of the second heat dissipation plate 3 are aligned with a plurality of first positioning holes 31 of the first heat dissipation plate 2 in the thickness direction, respectively. The second heat dissipation plate 3 is attached to the first heat dissipation plate 2 by the rivets 31. The width of the second heat dissipation plate 3 is approximately equal to the width of the first heat dissipation plate 2, or the width of the second heat dissipation plate 3 is smaller than the width of the first heat dissipation plate 2. The length of the second heat dissipation plate 3 is smaller than the length of the first heat dissipation plate 2.

In a heat sink 100 according to another embodiment, as shown in FIG. 7, the second heat dissipation plate 3' is fixed to the heat dissipation plate 2 by welding. The other structures of the heat sink shown in FIG. 7 are the same as those of the heat sink 100 of the embodiment shown in FIG. 2, and will not be described again in detail.

It will be understood by those skilled in the art that the above-described embodiments are exemplary and that modifications may be made by those skilled in the art, and that structures described in the various embodiments may be freely combined without conflict in structure or principle, thereby implementing a wider variety of heat sinks and housing assemblies while solving the technical problems of the present disclosure.

Although the embodiments of the present disclosure have been described in detail, it will be apparent to those skilled in the art that various changes and modifications can be made without departing from the scope and spirit of the appended claims, and the disclosure is not limited to the exemplary embodiments illustrated in the specification.

What is claimed is:

1. A heat sink, comprising
a heat sink body having a plurality of stacked fins; and
a mounting base including a first heat dissipation plate, a first surface of the first heat dissipation plate connected to a bottom of the heat sink body, and a second heat dissipation plate, discrete from the first heat dissipation plate, mounted on a second surface of the first heat dissipation plate opposite to the first surface, a length of the second heat dissipation plate in a longitudinal direction of the heat sink body is less than a length of the first heat dissipation plate in the longitudinal direction and a width of the second heat dissipation plate is less than a width of the first heat dissipation plate, the heat sink body including the plurality of stacked fins having a length in the longitudinal direction greater than the length of the first heat dissipation plate in the longitudinal direction, each fin of the plurality of stacked fins extending perpendicularly from a top of the first heat dissipation plate, a lower edge of each of the stacked fins having at least one tab extending downwardly therefrom, the tabs of the fins arranged in a row and forming a protrusion extending in a lateral direction and fixed to the first heat dissipation plate.

2. The heat sink of claim 1, wherein the first heat dissipation plate and the second heat dissipation plate are each rectangular.

3. The heat sink of claim 1, wherein the second heat dissipation plate is attached to the second surface by a plurality of rivets.

4. The heat sink of claim 1, wherein the second heat dissipation plate is welded on the second surface.

5. The heat sink of claim 1, wherein the second heat dissipation plate contacts an electronic module and transfers heat generated by the electronic module to the heat sink body.

6. The heat sink of claim 1, wherein at least one of an upper edge and the lower edge of each of the stacked fins has a folded edge extending in the longitudinal direction.

7. The heat sink of claim 6, wherein the stacked fins are connected in sequence by the folded edge of each of the stacked fins.

8. The heat sink of claim 1, wherein the tabs of the stacked fins define a plurality of laterally extending rows and are welded to the first surface of the first heat dissipation plate.

9. The heat sink of claim 1, wherein the first heat dissipation plate and the second heat dissipation plate are each made of an aluminum or an aluminum alloy material.

10. The heat sink of claim 6, wherein the upper edge and the lower edge of each of the stacked fins is folded, and the stacked fins are connected in sequence by the folded upper and lower edges.

11. The heat sink of claim 1, wherein the heat sink body extends beyond at least one end of the first heat dissipation plate in the longitudinal direction.

12. The heat sink of claim 1, wherein each longitudinal end of the second heat dissipation plate tapers in a direction away from the first heat dissipation plate.

13. The heat sink of claim 11, wherein:
a first end of the heat sink body extends a first distance beyond a first end of the first heat dissipation plate in the longitudinal direction, and a second end of the heat sink body extends a second distance beyond a second end of the first heat dissipation plate in the longitudinal direction, the first distance is greater than the second distance; and
the first end of the first heat dissipation plate extends beyond a first end of the second heat dissipation plate in the longitudinal direction by a third distance, and the second end of the first heat dissipation plate extends beyond a second end of the second heat dissipation plate in the longitudinal direction by a fourth distance, the third distance greater than the fourth distance.

14. The heat sink of claim 1, wherein the lower edge of each of the stacked fins has a plurality of tabs extending downwardly therefrom, the tabs of the fins arranged in a plurality of rows and forming protrusions extending in a lateral direction and fixed to the first heat dissipation plate.

15. A housing assembly, comprising:
a housing having an accommodating chamber adapted to accommodate an electronic module, the accommodating chamber having an opening in a top wall of the housing; and
a heat sink including:
a heat sink body having a plurality of stacked fins, each stacked fin having a folded upper edge and a folded lower edge, the stacked fins connected in sequence by each of the folded upper and lower edges, the folded upper edges of each stacked fin extend further than the folded lower edges of each stacked fin in at least one length direction of the heat sink body; and
a mounting base having a first heat dissipation plate and a second heat dissipation plate, a length of the second heat dissipation plate in a longitudinal direction of the heat sink body is less than a length of the first heat dissipation plate in the longitudinal direction and a width of the second heat dissipation plate is less than a width of the first heat dissipation plate, a first surface of the first heat dissipation plate connected to a bottom of the heat sink body, the second heat dissipation plate mounted on a second surface of the first heat dissipation plate opposite to the first surface, each of the fins of the plurality of stacked fins having a length in the longitudinal direction greater than a length of the mounting base and the first heat dissipate plate in the longitudinal direction, each fin of the plurality of stacked fins extending perpendicularly from the first heat dissipation plate, a lower edge of each fin of the plurality of stacked fins having at least one tab extending downwardly therefrom, the tabs of the fins arranged in a row and forming a protrusion extending in a lateral direction and fixed to the first heat dissipation plate, the heat sink including the plurality of stacked fins disposed on the top wall of the housing and the second heat dissipation plate extending through the opening and contacting the electronic module.

16. The housing assembly of claim 15, wherein the respective folded upper edges and the folded lower edges of each of the stacked fins are laminated together forming a ventilation channel between each pair of adjacent fins.

17. A heat sink, comprising:
a heat sink body having a plurality of stacked fins, an upper edge and a lower edge of each stacked fin is folded, the folded upper edges of each stacked fin extend further than the folded lower edges of each stacked fin in at least one length direction of the heat sink body; and
a mounting base including a first heat dissipation plate, a first surface of the first heat dissipation plate connected to a bottom of the heat sink body, and a second heat dissipation plate mounted on a second surface of the first heat dissipation plate opposite to the first surface, the heat sink body including the plurality of stacked fins having a length in the at least one length direction greater than a length of the first heat dissipation plate in the at least one length direction, each fin of the plurality of stacked fins extending perpendicularly from the first heat dissipation plate, a lower edge of each fin of the plurality of stacked fins having at least one tab extending downwardly therefrom, the tabs of the fins arranged in a row and forming a protrusion extending in a lateral direction and fixed to the first heat dissipation plate.

18. The heat sink of claim 17, wherein a length of the second heat dissipation plate is less than a length of the first heat dissipation plate.

19. The heat sink of claim 18, wherein a width of the second heat dissipation plate is less than a width of the first heat dissipation plate.

20. The heat sink of claim 17, wherein the folded upper edges of each of the stacked fins are laminated together forming a ventilation channel between each pair of adjacent fins.

* * * * *